United States Patent [19]

Wada et al.

[11] Patent Number: 5,058,063
[45] Date of Patent: Oct. 15, 1991

[54] NONVOLATILE SEMICONDUCTOR MEMORY DEVICE INCORPORATING LEVEL SHIFTING CIRCUITS

[75] Inventors: Yukio Wada; Tadashi Maruyama; Yasoji Suzuki, all of Yokohama, Japan

[73] Assignee: Kabushiki Kaisha Toshiba, Kawasaki, Japan

[21] Appl. No.: 454,740

[22] Filed: Dec. 21, 1989

[30] Foreign Application Priority Data

Dec. 22, 1988 [JP] Japan .................................. 63-324593

[51] Int. Cl.⁵ .............................................. G11C 16/02
[52] U.S. Cl. ................................. 365/185; 365/189.11
[58] Field of Search ............... 365/182, 184, 185, 104, 365/189.11, 226; 357/23.5; 307/560, 544

[56] References Cited

U.S. PATENT DOCUMENTS

| | | | |
|---|---|---|---|
| 4,628,487 | 12/1986 | Smayling | 365/104 |
| 4,769,787 | 11/1988 | Furusawa et al. | 365/184 |
| 4,794,564 | 7/1985 | Watanabe | 365/184 |
| 4,870,615 | 9/1989 | Maruyama et al. | 357/23.5 |

FOREIGN PATENT DOCUMENTS 0137245 4/1985 European Pat. Off. ....... 365/189.11

Primary Examiner—Terrell W. Fears
Assistant Examiner—Jack A. Lane
Attorney, Agent, or Firm—Finnegan, Henderson, Farabow, Garrett and Dunner

[57] ABSTRACT

In a nonvolatile semiconductor memory system comprising a memory chip and a batttery for driving the memory chip, the memory chip includes a memory-cell matrix, a row decoder, a first level-shifting circuit for shifting the level of the output of the row decoder, a column-selecting circuit, a column decoder, a second level-shifting circuit for shifting the level of the output of the column decoder, a sense amplifier, a third level-shifting circuit for shifting the level of the data which is to be written into the memory-cell matrix, a voltage-booster circuit, a timer circuit, and an oscillator circuit. The nonvolatile semiconductor memory system operates stably when driven by a low voltage or by a voltage over a broad range.

20 Claims, 10 Drawing Sheets

| MODE | ERASE | WRITE | READ |
|---|---|---|---|
| BL | 0$^V$ | 20$^V$ | 1$^V$ |
| SG | 20$^V$ | 20$^V$ | 5$^V$ |
| CG | 20$^V$ | 0$^V$ | 0$^V$ |
| S | 0$^V$ | 5$^V$ | 0$^V$ |

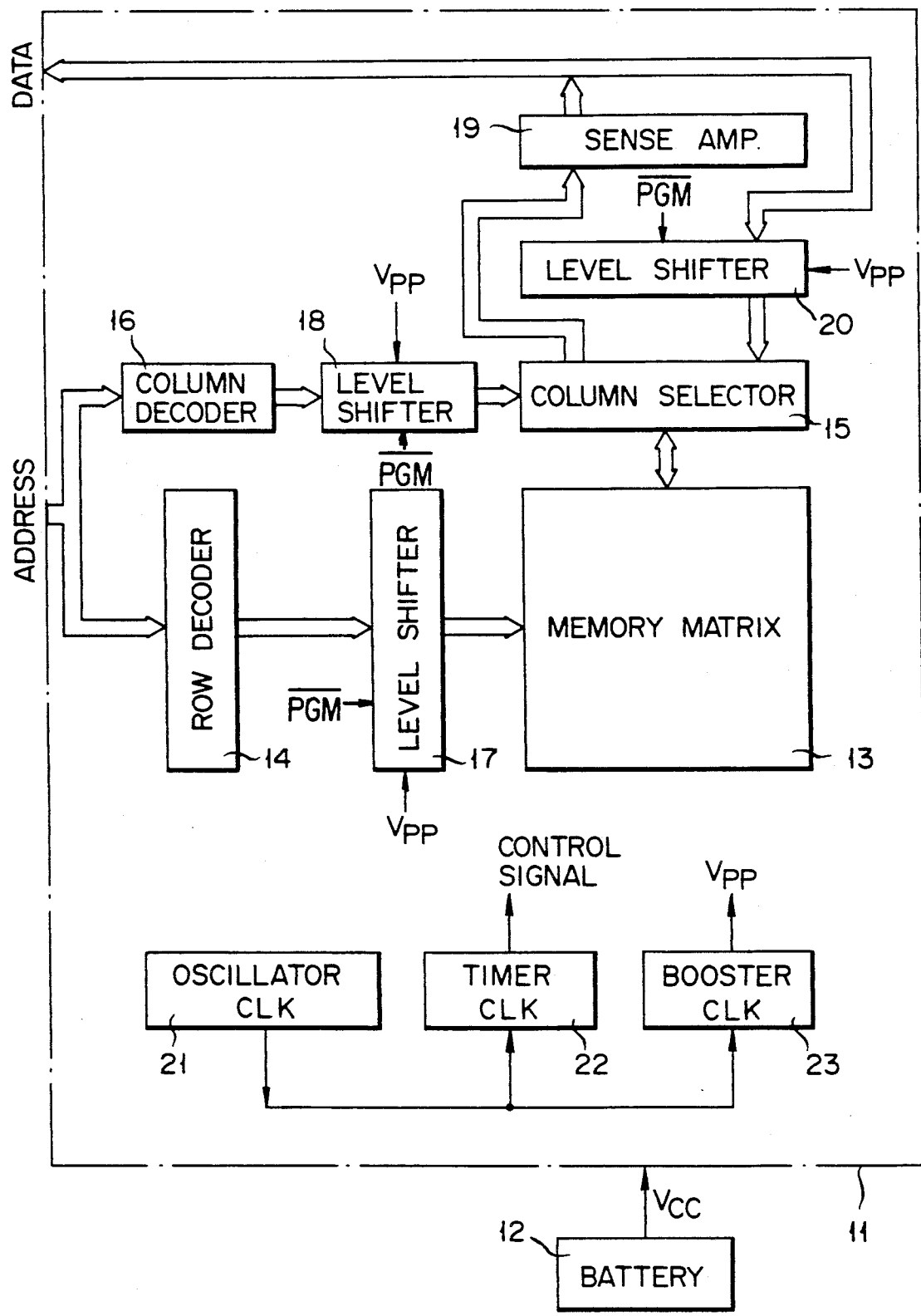
F I G. 5

| MODE | ERASE | WRITE | READ |
|---|---|---|---|
| WL | 0$^V$ | 20$^V$ | 0$^V$ |
| WG | 20$^V$ | 20$^V$ | 5$^V$ |
| CG | 20$^V$ | 0$^V$ | 0$^V$ |
| RG | 0$^V$ | 0$^V$ | 5$^V$ |
| RL | — | — | 5$^V$ |
F I G. 8
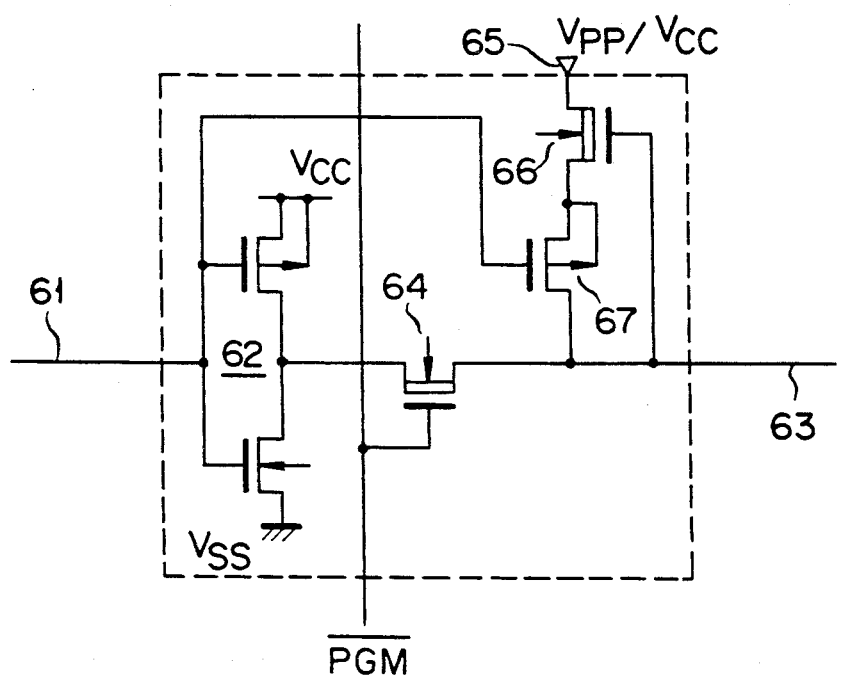
F I G. 9

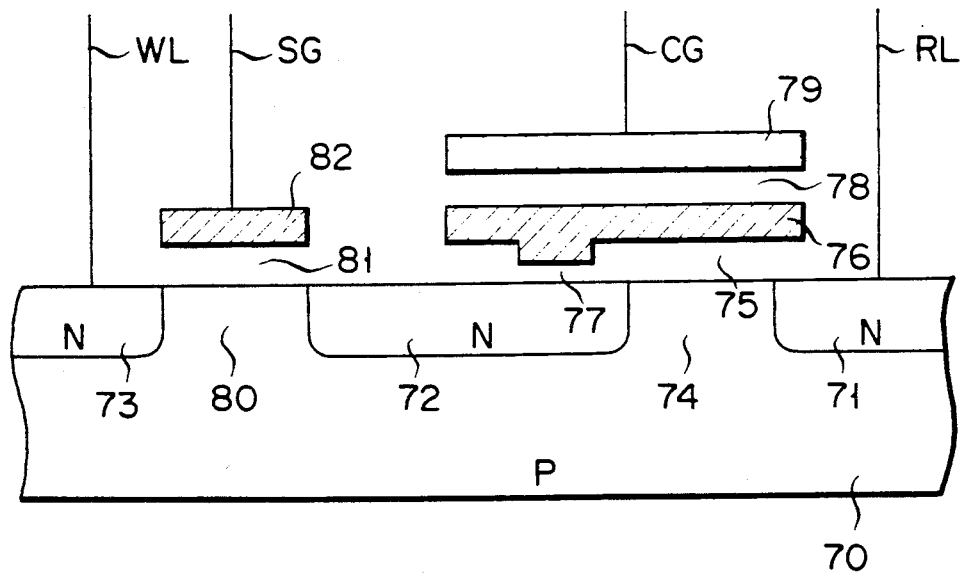
F I G. 10
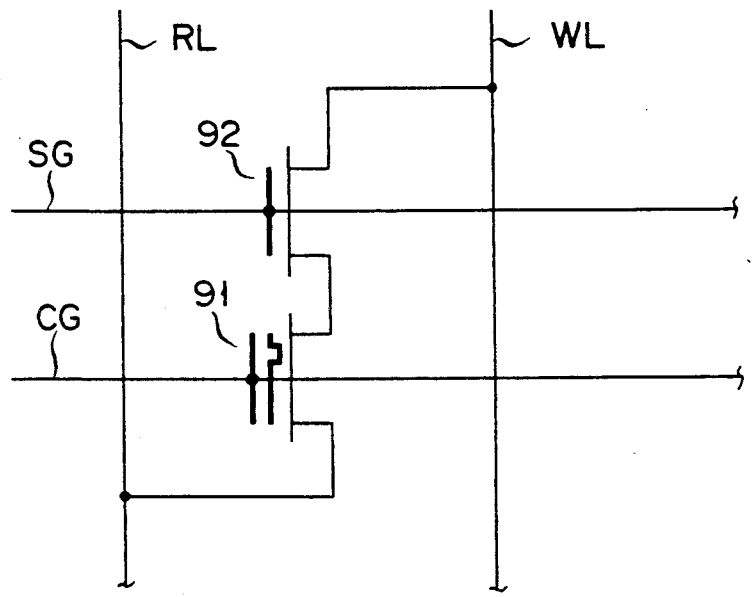
F I G. 11

| MODE | ERASE | WRITE | READ |
|---|---|---|---|
| WL | 0$^V$ | 20$^V$ | 0$^V$ |
| SG | 20$^V$ | 20$^V$ | 5$^V$ |
| CG | 20$^V$ | 0$^V$ | 0$^V$ |
| RL | 0$^V$ | 5$^V$ | 5$^V$ |

FIG. 12

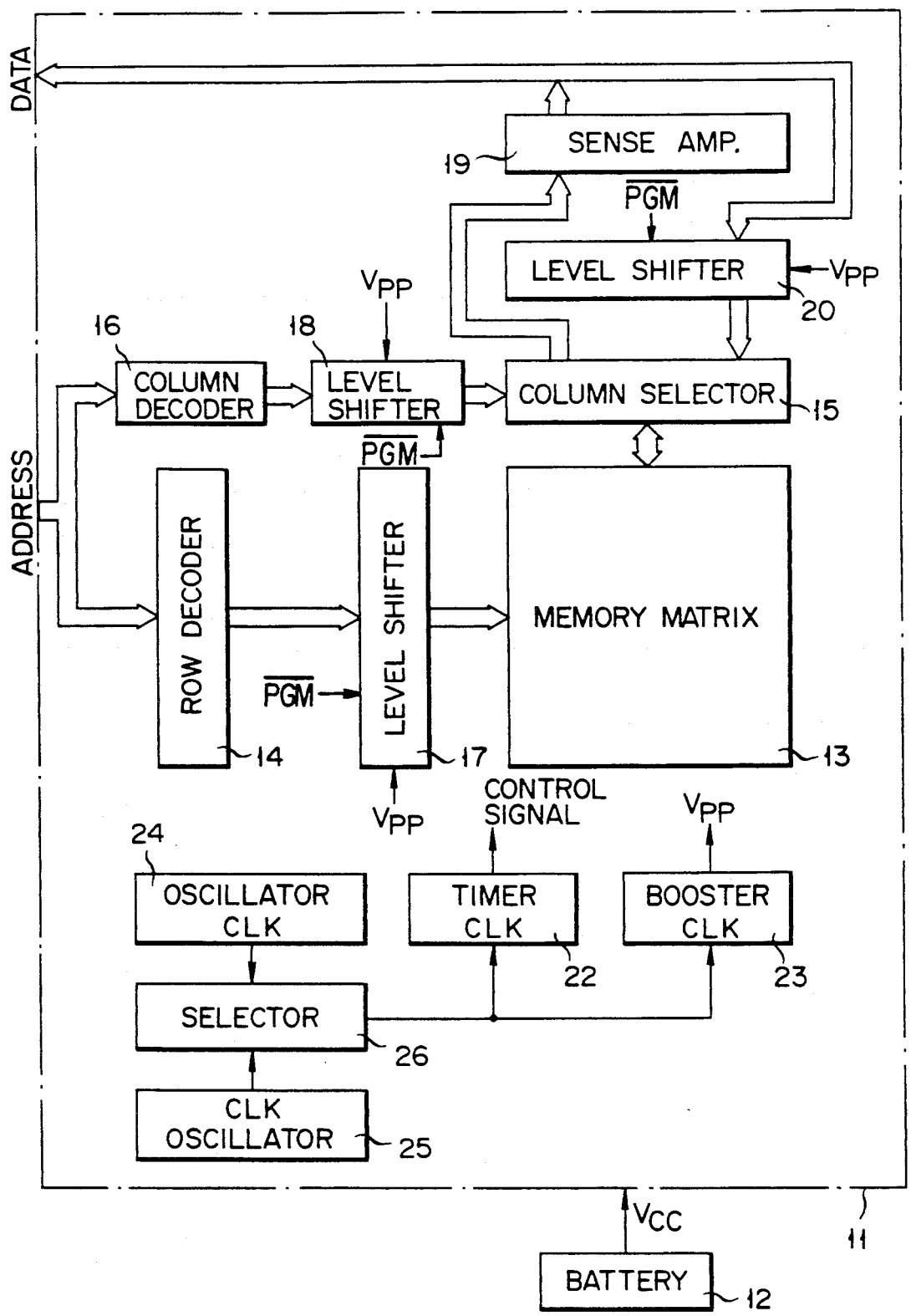
F I G. 13

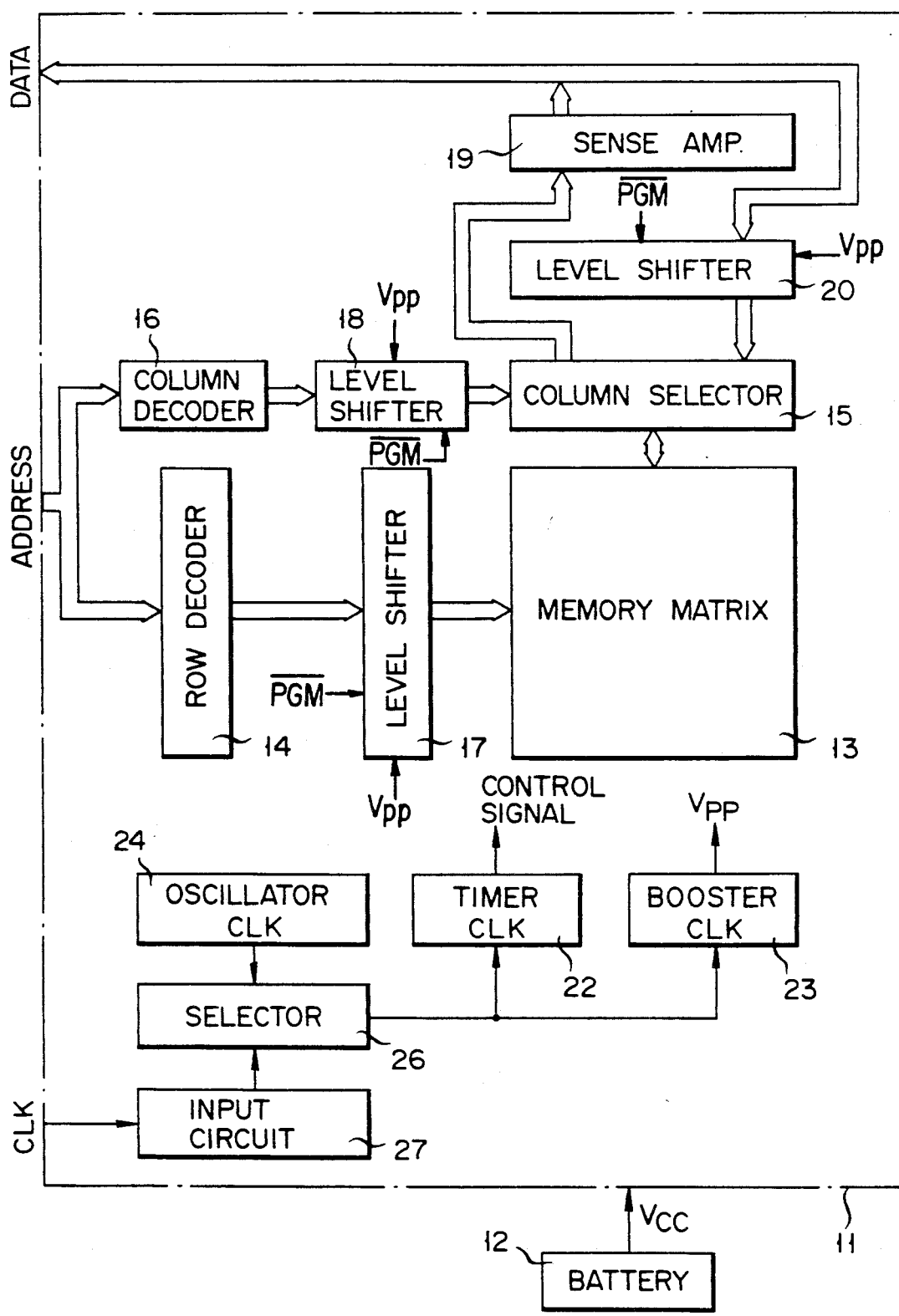
F I G. 14

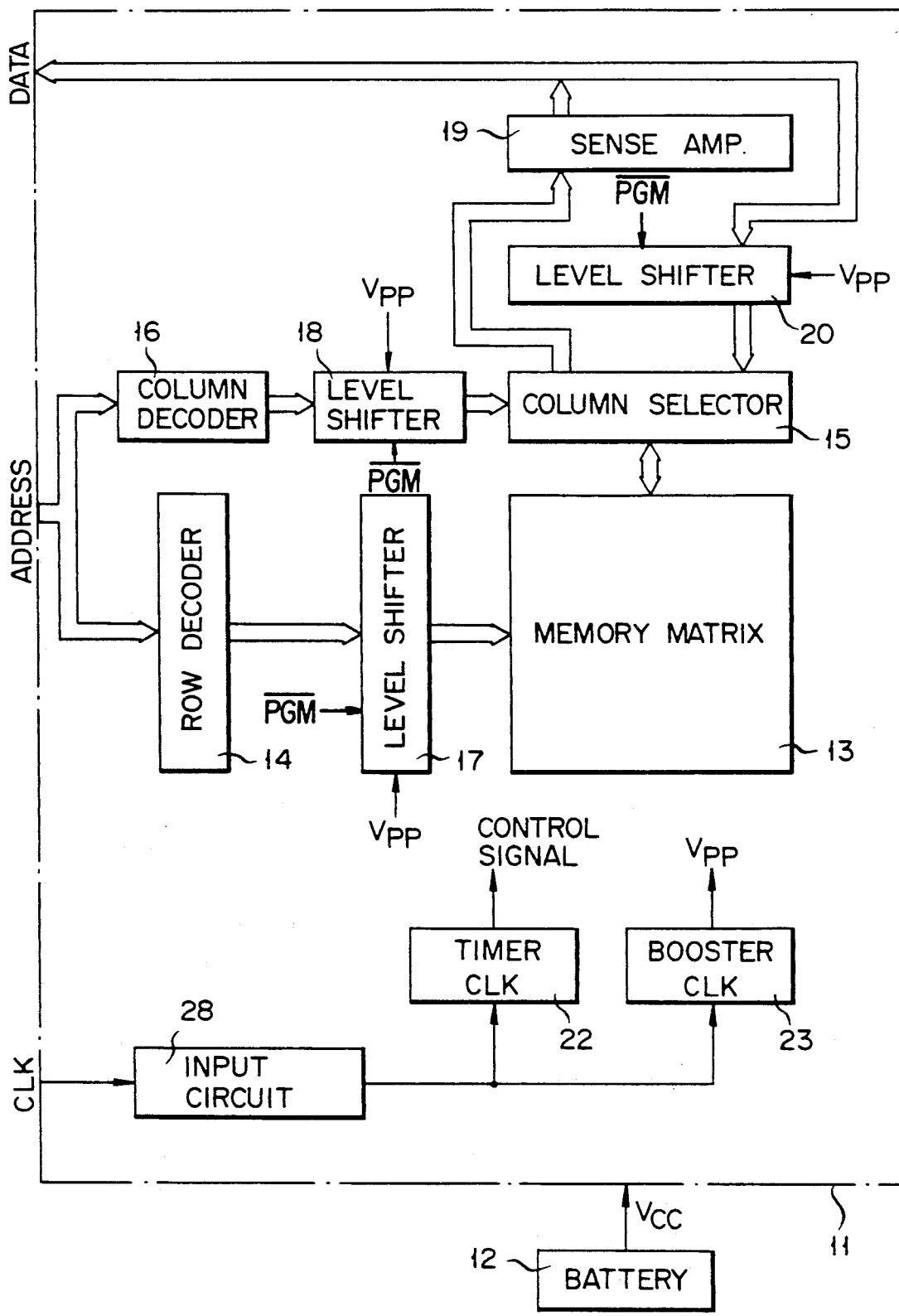
F I G. 15

NONVOLATILE SEMICONDUCTOR MEMORY DEVICE INCORPORATING LEVEL SHIFTING CIRCUITS

BACKGROUND OF THE INVENTION

1. Field of the Invention

The present invention relates to a nonvolatile semiconductor memory system into which data can be written and from which data can be erased, and more particularly, to a nonvolatile semiconductor memory system for use in an apparatus whose operating voltage ranges broadly, from a low voltage to a high voltage.

2. Description of the Related Art

Nonvolatile semiconductor memories, into which data can be electrically written, and from which data can be erased, are generally known as E²PROMs (Electrically Erasable Programmable Read-Only Memories). An E²PROM chip contains various components. Among these components are: a memory-cell matrix, a row decoder, a column selector, a column decoder, three level shifters, a sense amplifier, an oscillator, a timer, and a voltage booster. The memory-cell matrix comprises a number of memory cells arranged in rows and columns. The row decoder selects one of the rows of memory cells. The column selector selects one of the columns of memory cells. The column decoder controls the column selector. The first level shifter shifts the level of the output of the row decoder and then supplies the output of the row decoder to the memory-cell matrix. The second level shifter shifts the level of the output of the column decoder and then supplies the output of the column decoder to the column selector. The sense amplifier detects the data read from the memory cell which has been selected by the column selector. The third level shifter shifts the level of input data, and supplies this data to the memory-cell matrix so as to write the data into the memory cell which has been selected by the column selector. The oscillator generates a clock signal. The timer generates various control signals from the clock signal generated by the oscillator. The voltage booster is driven by the clock signal, and boosts a power-supply voltage.

The operating power-supply voltages of most E²-PROMs commercially available at present are 5 V±10%, 4.5 V to 5.5 V. Hence, these E²PROMs can be used in apparatuses for industrial use, without causing any problem. If they are to be incorporated into battery-powered apparatuses for general consumers, such as cameras, car audios, IC cards, however, they should operate over a broad range of operating voltage, from about 1.5 V to about 5.5 V.

It is the memory cells, the level shifters, and the oscillator which limit the operating voltage of the conventional E²PROM to 5 V±10%. The other components of the E²PROM, i.e., the row decoder, the column selector, column decoder, the sense amplifier, the timer can operate over a relatively broad range of voltages since they are CMOS static circuits. Also, the voltage booster can operated over a broad range of voltages since it is a combination circuit comprising diode-connected transistors and coupling capacitors.

FIG. 1 is a sectional view illustrating one of the memory cells incorporated in the conventional E²PROM. As is shown in this figure, N-type diffusion layers 101, 102, and 103 are formed in the surface of a P-type semiconductor substrate 100. A channel region 104 is formed in the surface of the substrate 100, located between the diffusion layers 101 and 102. A relatively thick insulating film 105 is formed on the substrate 100. The film 105 has a thin portion 107 located on the diffusion layer 102. An electrode 106, made of polycrystalline silicon, is formed on the insulating film 105 and located above the channel region 104 and the diffusion layer 102. A relatively thick insulating film 108 is formed on the electrode 106, an electrode 109 made of polycrystalline silicon is formed on this insulating film 108. Therefore, the electrode 109 overlaps the electrode 106.

Another channel region 110 is formed in the surface of the substrate 100, located between the diffusion layers 102 and 103. A comparatively thick insulating film 111 is formed on the channel region 110. An electrode 112 made of polycrystalline silicon is formed on this insulating film 111.

The diffusion layer 101 is connected to a source line S, and the diffusion layer 103 is connected to a bit line BL. The electrodes 106, 109, and 112 are the floating-gate electrode, control-gate electrode, and gate electrode of the memory cell, respectively. The control-gate electrode 109 is connected to a control-gate line CG, the gate electrode 112 is connected to a selection-gate line SG.

FIG. 2 is an equivalent circuit diagram showing the memory cell illustrated in FIG. 1. As is understood from FIG. 2, the memory cell comprises two transistors 131 and 132. The transistor 131 has a floating-gate and is designed to store data. Its source and drain are the diffusion layers 101 and 102 (FIG. 1), respectively. The transistor 132 is an ordinary MOS and used to select the data-storage transistor 131. Its source and drain are the diffusion layers 102 and 103 (FIG. 1), respectively.

The memory cell has three operation modes, i.e., data-erasing mode, data-writing mode, and data-reading mode. FIG. 3 shows the voltages applied to the source line S, the bit line BL, the control-gate line CG, and the selection-gate line SG when the memory cell is set to the data-erasing mode, and also the voltages applied to these lines when the memory cell is set to the data-writing mode. Three power-supply voltages are used in the conventional E²PROM chip. They are: $V_{SS}$, $V_{CC}$, and $V_{PP}$. In most cases, $V_{SS}=0$ V, $V_{CC}=5$ V, and $V_{PP}=20$ V. The high voltage $V_{PP}$(20 V) is obtained by multiplying the external power-supply voltage by means of the voltage-multiplying circuit incorporated in the E²PROM chip.

It will be explained how the memory cell operates when set to the data-erasing mode. In the data-erasing mode, also known as "electron injection mode," electrons are injected into the floating-gate electrode 106, thereby to increase the threshold voltage of the data-storage transistor 131. The voltage applied in this mode to the lines BL, SG, CG, and S are 0 V, 20 V, 20 V, and 0 V, respectively. When the selection-gate line SG is set at 20 V, the selection transistor 132 is turned on, whereby 0 V is applied from the bit line BL to the N-type diffusion layer 102, and 20 V is applied to the floating-gate electrode 106 from the control-gate line CG. Hence, an intense electric field is applied to the thin insulating film 107 interposed between the electrode 106 and the N-type diffusion layer 102. A tunnel current therefore flows from the N-type diffusion layer 102 to the floating-gate electrode 106, and electrons are injected into the floating-gate electrode 106. As a result of this, the threshold voltage of the data-storage transistor 131 increases to, for example, about +8 V.

It will be explained how the memory cell operates when set to the data-writing mode. In the data-writing mode, also known as "electron emission mode," electrons are emitted from the electrode 106, thereby to lower the threshold voltage of the data-storage transistor 131. The voltage applied in the data-writing mode to the lines BL, SG, CG, and S are 20 V, 20 V, 0 V, and 5 V, respectively, thereby setting the transistor 131 in a floating condition. When the selection-gate line SG is set at 20 V, the selection transistor 132 is turned on, whereby 20 V is applied from the bit line BL to the N-type diffusion layer 102. Hence, an intense electric field is applied to the thin insulating film 107 in the direction opposite to that direction in which the electric field is applied in the data-erasing mode. A tunnel current therefore flows from the floating-gate electrode 106 to the N-type diffusion layer 102, and electrons are emitted from the floating-gate electrode 106. As a result, the threshold voltage of the data-storage transistor 131 decreases to, for example, about −5 V.

When the memory cell is set to the data-reading mode, 1 V, 5 V, 0 V, and 0 V are applied to the lines BL, SG, CG, and S, respectively. When 5 V is applied to the selection-gate line SG, the selection transistor 132 is turned on, whereby 1 V is applied to the N-type diffusion layer 102. If electrons are being injected into the floating-gate electrode 106 at this time, the threshold voltage of the memory cell is increasing. Hence, the data-storage transistor 131 is not turned on. No current therefore flows between the bit line BL and the source line S, and the bit line BL remains at 1 V. On the other hand, if electrons are being emitted from the floating-gate electrode 106, the threshold voltage of the memory cell is decreasing. Hence, the data-storage transistor 131 is turned on, and a current flows between the bit line BL and the source line S. As a result, the bit line BL is set at 0 V, i.e., the voltage applied to the source electrode S. That is, while the memory cell is set in the data-reading mode, the difference between the two potentials (i.e., 1 V and 0 V) at which the bit line BL can be set is amplified by the sense amplifier, thereby to determine whether "1" or "0" is being read out of the memory cell.

A problem with the memory cell is that the sense amplifier must detects a small potential difference of only 1 V in order to determine whether "1" or "0" is being read out of the memory cell. Here arises the questions of why the potential of the bit line BL should be maintained at 1 V, not being increased to 5 V. It will be explained why. While the memory cell is set to the data-reading mode, the bit line BL is set at 5 V. In this case, the N-type diffusion layer 102 remains at about 5 V, and the electric field generated by the difference of the potential (0 V) of the control gate CG and that (5 V) of the N-type diffusion layer 102 is applied to the thin insulating film 107 through the floating-gate electrode 106.

The manner and direction in which the electric field is applied in the data-reading mode are the same as those in the data-writing mode (i.e., electron emission mode), but the electric field is less intense than in the data-writing mode. If any memory cell into which electrons have been injected is set in the data-reading mode for a long time, the electrons are gradually emitted from the cell due to tunnel effect, inevitably reducing the threshold voltage of the cell. Upon lapse of a certain period of time, the data stored in the memory cell can no longer be read out correctly. This undesirable phenomenon is called "soft writing," and said period of time is called "read retention characteristic."

In order to improve the read retention characteristic, it necessary to lower the voltage on the bit line BL in the data-reading mode. When this voltage is reduced, however, the difference between the voltage applied to the bit line BL while electrons are being injected into the cell and the voltage applied to the bit line BL while electrons are being emitted from the cell decreases, thus reducing the logic margin of the memory cell. Therefore, in the conventional E²PROM, the bit-line voltage is set at about 1 V to impart a sufficient read retention characteristic to each memory cell, and a high-efficiency sense amplifier is used to give a sufficient logic margin to each memory cell. Since the sense amplifier has a high efficiency, the margin of its operating voltage is too small for the reading of data from each memory cell shown in FIG. 1. In other words, the data can hardly be read from the cell when the sense amplifier is driven by a relatively low voltage.

FIG. 4 is a circuit diagram illustrating one of the level shifters incorporated in the conventional E²PROM. As is shown in this figure, the level shifter comprises a capacitor 144 and two N-channel MOS transistors 142 and 145. The gate of the transistor 142 is connected to an input terminal 141, and the drain of this transistor is connected to a terminal 143 to which a high voltage $V_{PP}$ or an ordinary power-supply voltage $V_{CC}$ is applied. A clock signal is supplied to the source of the transistor 142 through the capacitor 144. The source-drain path of the transistor 145 is connected between the source and drain of the transistor 142. The gate of the transistor 145 is coupled to the source of the transistor 152.

When the clock signal is supplied to one end of the capacitor 144, the source voltage of the transistor 142 increases. The high source voltage of the transistor 142 is applied to the gate of the transistor 142 via the transistor 145, thereby gradually decreasing the conduction resistance of the transistor 142. As a result of this, the high voltage VPP is applied to the input terminal 141 through the transistors 142 and 145, to shift the level of the input data, that of the output of the row decoder, or that of the level of the column decoder.

When the power-supply voltage of the level shifter is low, the amplitude of the clock signal become proportionally small. Thus, the capacitor 144 can no longer increases the source voltage of the transistor 142 to an adequate degree. Consequently, the high voltage $V_{PP}$ cannot be completely applied to the input terminal 141 through the transistor 142 or 145. Hence, the level shifter cannot achieve a complete level shifting. In view of this, the level shifter shown in FIG. 4 cannot perform its function well when driven by a relatively low voltage, just like the memory cell shown in FIGS. 1 and 2.

The oscillator for generating the clock signal comprises a ring oscillator in most cases. The oscillation frequency of the ring oscillator directly depend upon the power-supply voltage. When the power-supply voltage is 5±10%, the oscillator may have an optimal oscillation frequency. However, the oscillation frequency falls very much when the power-supply voltage is as low as 1.5 V. Inevitably, the voltage generated by the voltage-multiplying circuit cannot be high enough to write data into, or erase data from, any memory cell of the conventional E²PROM.

Since the operating voltage of the conventional E²-PROM falls within an extremely narrow range, the E²PROM cannot be driven by means of batteries.

SUMMARY OF THE INVENTION

Accordingly, it is the object of the present invention to provide a nonvolatile semiconductor memory system which can operates stably when driven by a low voltage or by a voltage over a broad range.

A nonvolatile semiconductor memory system according to the invention comprises a memory chip and a battery for driving the memory chip. The memory chip comprises a memory-cell matrix, a row decoder, a first level-shifting circuit for shifting the level of the output of the row decoder, a column-selecting circuit, a column decoder, a second level-shifting circuit for shifting the level of the output of the column decoder, a sense amplifier, a third level-shifting circuit for shifting the level of the data which is to be written into the memory-cell matrix, a voltage-multiplying circuit, a timer circuit, and an oscillator circuit.

According to the present invention, there is provided a nonvolatile semiconductor memory system comprising a memory chip and a battery for driving said memory chip, said memory chip comprising:

a memory-cell matrix comprising a plurality of memory cells arranged in rows and columns, each including a nonvolatile transistor;

a row decoder for selecting one of rows of memory cells;

a first level-shifting circuit for level-shifting an amplitude of an output voltage of said row decoder and applying the voltage to said memory-cell matrix;

a column-selecting circuit for selecting one of columns of memory cells;

a column decoder for controlling said column-selecting circuit;

a second level-shifting circuit for level-shifting an amplitude of an output voltage of said column decoder and applying the voltage to said column-selecting circuit;

a sense amplifier for detecting data stored in the memory cell selected by said row decoder and said column-selecting circuit;

a third level-shifting circuit for level-shifting an amplitude of the voltage of input data in order to write the input data into the memory cell selected by said column decoder and said column-selecting circuit, and applying the voltage to said column-selecting circuit;

a voltage booster circuit for generating a high voltage required for writing the input data into the memory cell, and applying the high voltage to said first, second and third level-shifting circuits; and a timer circuit for setting data-writing time for writing data into the memory cells incorporated in said memory-cell matrix, and generating various control signals in accordance with the data-writing time thus set; and an oscillator circuit for generating a clock signal for driving said voltage booster circuit and said timer circuit.

According to the present invention, there is further provided a nonvolatile semiconductor memory system comprising a memory chip and a battery for driving said memory chip, said memory chip comprising:

a memory-cell matrix comprising a plurality of memory cells arranged in rows and columns, each including a nonvolatile transistor;

a row decoder for selecting one of rows of memory cells;

a first level-shifting circuit for level-shifting an amplitude of an output voltage of said row decoder and applying the voltage to said memory-cell matrix;

a column-selecting circuit for selecting one of columns of memory cells;

a column decoder for controlling said column-selecting circuit;

a second level-shifting circuit for level-shifting an amplitude of an output voltage of said column decoder and applying the voltage to said column-selecting circuit;

a sense amplifier for detecting data stored in the memory cell selected by said row decoder and said column-selecting circuit;

a third level-shifting circuit for level-shifting an amplitude of the voltage of input data in order to write the input data into the memory cell selected by said column decoder and said column-selecting circuit, and applying the voltage to said column-selecting circuit;

a voltage booster circuit for generating a high voltage required for writing the input data into the memory cell, and applying the high voltage to said first, second and third level-shifting circuits;

a timer circuit for setting data-writing time for writing data into the memory cells incorporated in said memory-cell matrix, and generating various control signals in accordance with the data-writing time thus set;

a first oscillator circuit for generating a first clock signal of a predetermined frequency when a power-supply voltage is relatively low;

a second oscillator circuit for generating a second clock signal of a frequency similar to that of the first clock signal when the power-supply voltage is relatively high; and a selector circuit for selecting said first or second clock signal, and supplying the selected clock signal as a drive signal to said voltage booster circuit and said timer circuit.

According to the present invention, there is still further a nonvolatile semiconductor memory system comprising a memory chip and a battery for driving said memory chip, said memory chip comprising:

a memory-cell matrix comprising a plurality of memory cells arranged in rows and columns, each including a nonvolatile transistor;

a row decoder for selecting one of rows of memory cells;

a first level-shifting circuit for level-shifting an amplitude of an output voltage of said row decoder and applying the voltage to said memory-cell matrix;

a column-selecting circuit for selecting one of columns of memory cells;

a column decoder for controlling said column-selecting circuit;

a second level-shifting circuit for level-shifting an amplitude of an output voltage of said column decoder and applying the voltage to said column-selecting circuit;

a sense amplifier for detecting data stored in the memory cell selected by said row decoder and said column-selecting circuit;

a third level-shifting circuit for level-shifting an amplitude of the voltage of input data in order to write the input data into the memory cell selected by said column decoder and said column-selecting circuit, and applying the voltage to said column-selecting circuit;

a voltage booster circuit for generating a high voltage required for writing the input data into the memory cell, and applying the high voltage to said first, second and third level-shifting circuits;

a timer circuit for setting data-writing time for writing data into the memory cells incorporated in said memory-cell matrix, and generating various control signals in accordance with the data-writing time thus set;

an oscillator circuit for generating a first clock signal of a predetermined frequency when a power-supply voltage is relatively low or relatively high;

a clock-signal input circuit for inputting a second, externally supplied clock signal of a predetermined frequency when when the power-supply voltage is relatively high or relatively low; and a selector circuit for selecting said first or second clock signal, and supplying the selected clock signal as a drive signal to said voltage booster circuit and said timer circuit.

According to the present invention, there is yet further a nonvolatile semiconductor memory system comprising a memory chip and a battery for driving said memory chip, said memory chip comprising:

a memory-cell matrix comprising a plurality of memory cells arranged in rows and columns, each including a nonvolatile transistor;

a row decoder for selecting one of rows of memory cells;

a first level-shifting circuit for level-shifting an amplitude of an output voltage of said row decoder and applying the voltage to said memory-cell matrix;

a column-selecting circuit for selecting one of columns of memory cells;

a column decoder for controlling said column-selecting circuit;

a second level-shifting circuit for level-shifting an amplitude of an output voltage of said column decoder and applying the voltage to said column-selecting circuit;

a sense amplifier for detecting data stored in the memory cell selected by said row decoder and said column-selecting circuit;

a third level-shifting circuit for level-shifting an amplitude of the voltage of input data in order to write the input data into the memory cell selected by said column decoder and said column-selecting circuit, and applying the voltage to said column-selecting circuit;

a voltage booster circuit for generating a high voltage required for writing the input data into the memory cell, and applying the high voltage to said first, second and third level-shifting circuits;

a timer circuit for setting data-writing time for writing data into the memory cells incorporated in said memory-cell matrix, and generating various control signals in accordance with the data-writing time thus set;

a clock-signal input circuit for receiving an externally input clock signal of a predetermined frequency and supplying the clock signal to said voltage booster circuit and said timer circuit.

BRIEF DESCRIPTION OF THE DRAWINGS

FIG. 5 is a block diagram showing a nonvolatile semiconductor memory system according to a first embodiment of the present invention;

FIG. 8 is a table showing the voltages applied to each component of the memory cell shown in FIG. 6, when the E$^2$PROM is Set in various operating modes;

FIG. 9 is a circuit diagram representing the level shifter used in the E$^2$PROM shown in FIG. 5;

FIG. 10 is a sectional view showing the structure of a memory cell of a different type which can be incorporated in the E$^2$PROM illustrated in FIG. 5;

FIG. 11 is an equivalent circuit diagram of the memory cell shown in FIG. 10;

FIG. 12 is a table showing the voltages applied to each component of the memory cell shown in FIG. 10 and incorporated in the E$^2$PROM, when the E$^2$PROM is set in various operating modes;

FIG. 13 is a block diagram showing a nonvolatile semiconductor memory system according to a second embodiment of this invention;

FIG. 14 is a block diagram showing a nonvolatile semiconductor memory system according to a third embodiment of the invention; and FIG. 15 is a block diagram showing a nonvolatile semiconductor memory system according to a fourth embodiment of the present invention.

DETAILED DESCRIPTION OF THE PREFERRED EMBODIMENTS

Figure 1:
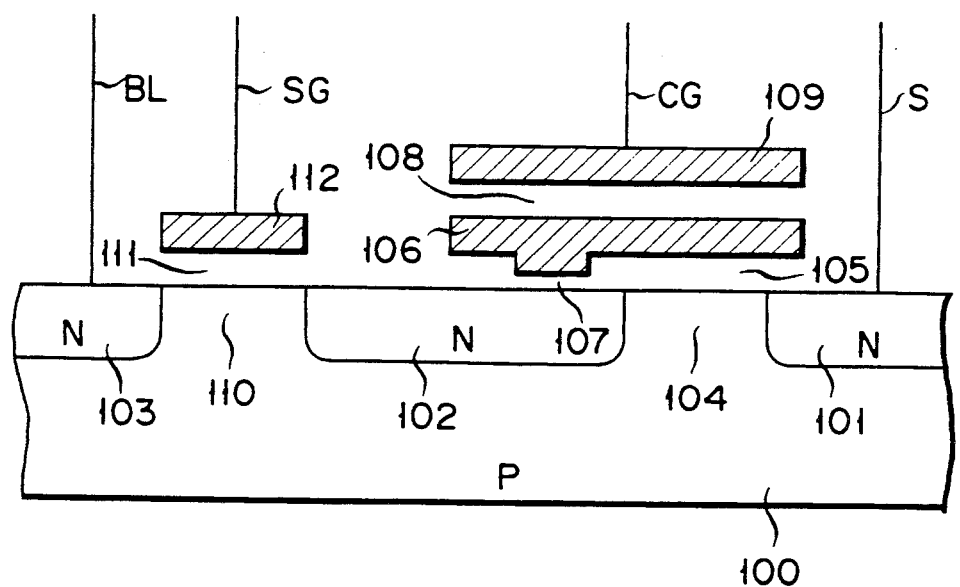
FIG. 1 is a sectional view showing the structure of each memory cell incorporated in a conventional E$^2$-PROM.

The present invention will now be described in detail, with reference to embodiments which are illustrated in the accompanying drawings.

FIG. 5 is a block diagram showing an E$^2$PROM which is the first embodiment of the nonvolatile semiconductor memory system according to the present invention. As is shown in FIG. 5, the E$^2$PROM comprises an E$^2$PROM chip 11 and a battery 12 for applying a power-supply voltage $V_{CC}$ to the chip 11. The E$^2$PROM chip 11 contains various components. Among these components are: a memory-cell matrix 13, a row decoder 14, a column selector 15, a column decoder 16, three level shifters 17, 18 and 20, a sense amplifier 19, an oscillator 21, a timer 22, and a voltage booster 23. The memory-cell matrix 13 comprises a number of memory cells arranged in rows and columns. The row decoder 14 selects one of the rows of memory cells. The column selector 15 selects one of the columns of memory cells. The column decoder 16 controls the column selector 15 in accordance with an address input to the E$^2$PROM chip 11. The first level shifter 17 shifts the level of the output of the row decoder 14 and then supplies the output of the row decoder 14 to the memory-cell matrix 13. The second level shifter 18 shifts the level of the output of the column decoder 16 and then supplies the output of the column decoder 16 to the column selector 15. The sense amplifier 19 detects the data read from the memory cell which has been selected by the column selector 15. The third level shifter 20 shifts the level of input data, and supplies this data to the memory-cell matrix 11 so as to write the data into the memory cell which has been selected by the column selector 15. The oscillator 21 generates a clock signal. The timer 22 generates various control signals from the clock signal generated by the oscillator 21. The voltage booster 23 is driven by the clock signal, and boosts the power-supply voltage $V_{CC}$ applied from the battery 12, thereby generating a high voltage $V_{PP}$. The high voltage $V_{PP}$ are applied to the level shifters 17, 18, and 20.

Figure 6:
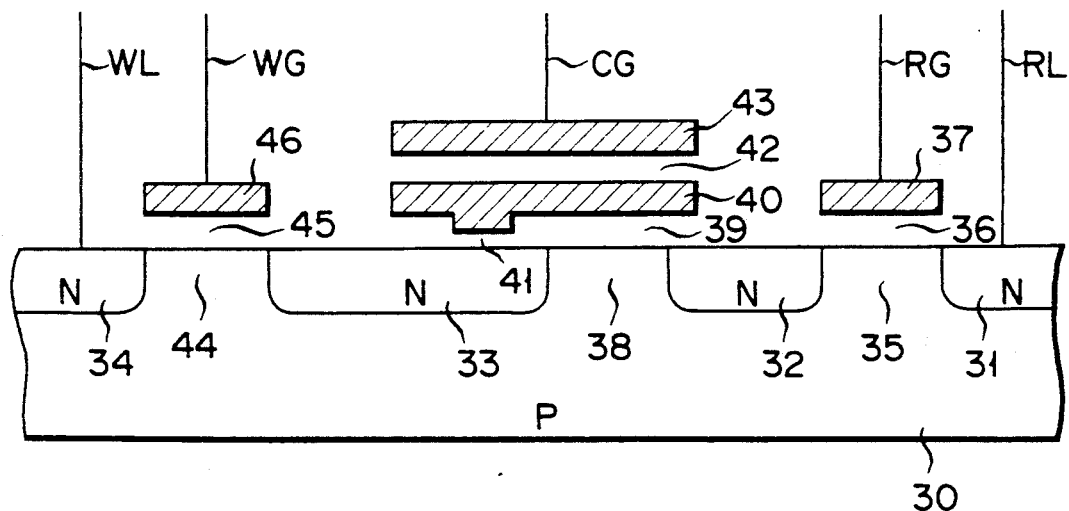
FIG. 6 is a sectional view showing the structure of each memory cell incorporated in the E$^2$PROM illustrated in FIG. 5.

FIG. 6 is a sectional view illustrating one of the memory cells incorporated in the matrix 13. As is shown in FIG. 6, N-type diffusion layers 31, 32, 33, and 34 are formed in the surface of a P-type semiconductor substrate 30. A channel region 35 is formed in the surface of the substrate 30 and between the diffusion layers 31 and 32. A relatively thick insulating film 36 is formed on one portion of the substrate 30. An electrode 37 made of polycrystalline silicon is formed on the insulating film 36 and located above the channel region 35. Another channel region 38 is formed in the surface of the substrate 30, being located between the diffusion layers 32 and 33. A relatively thick insulating film 39 is formed on the substrate 30. It is placed in the same plane as the insulating film 36, and has a thin portion 41. An electrode 40, also made of polycrystalline silicon, is formed on the insulating film 39 and located above the channel region 38. The electrode 40 overlaps the channel region 38, partly the diffusion layer 32, and partly the diffusion layer 33. That portion of the electrode 40, which is formed on the thin portion 41 of the film 39, is located above the diffusion layer 33. A relatively thick insulating film 42 is formed on the electrode 40, and an electrode 43 made of polycrystalline silicon is formed on this insulating film 42 and is located above the electrode 40.

Another channel region 44 is formed in the surface of the substrate 30, located between the diffusion layers 33 and 34. A comparatively thick insulating film 45 is formed on the channel region 44. An electrode 46 made of polycrystalline silicon is formed on this insulating film 45.

The diffusion layer 31 is connected to a read line RL, and the diffusion layer 34 is connected to a write line WL. The electrodes 37 and 46 are gate electrodes, the electrode 40 is a floating-gate electrode, and the electrode 43 is a control gate electrode. A gate line RG is connected to the gate electrode 37, a control-gate electrode CG is connected to the control gate electrode 43, and a write-gate line WG is connected to the gate electrode 46.

Figure 7:
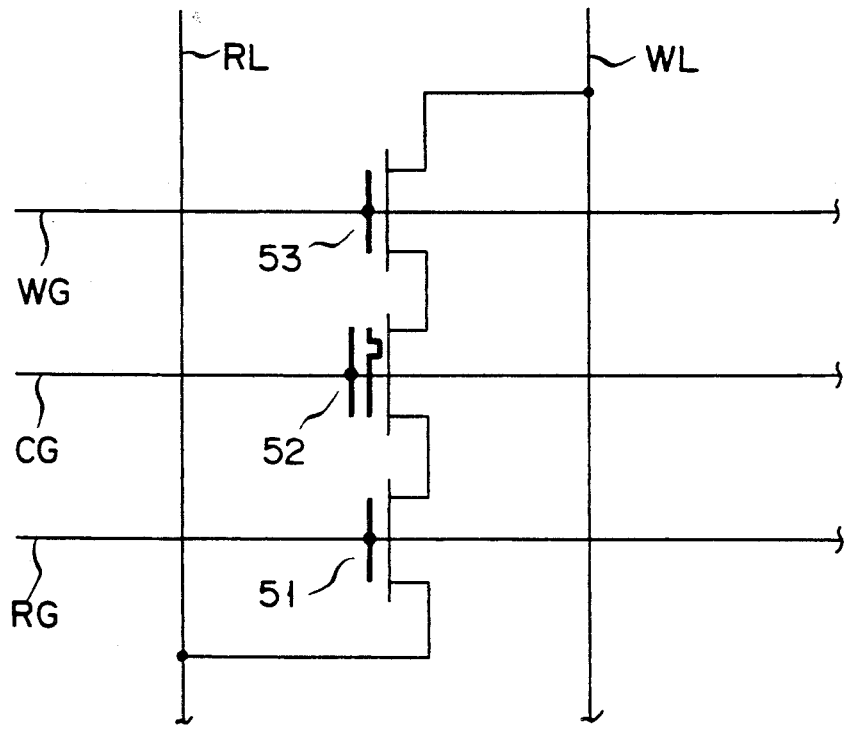
FIG. 7 is an equivalent circuit diagram of the memory cell shown in FIG. 6.

FIG. 7 is an equivalent circuit diagram showing the memory cell illustrated in FIG. 6. As is shown in this figure, the memory cell comprises a MOS transistor 51 of the ordinary type used as first selecting transistor, a floating-gate transistor 52 used as a data-storage transistor, and a MOS transistor 53 of ordinary type used as second selecting transistor. The source and drain of the MOS transistor 51 are the diffusion layers 31 and 32, and the source and drain of the transistor 52 are the diffusion layers 32 and 33.

Figure 2:
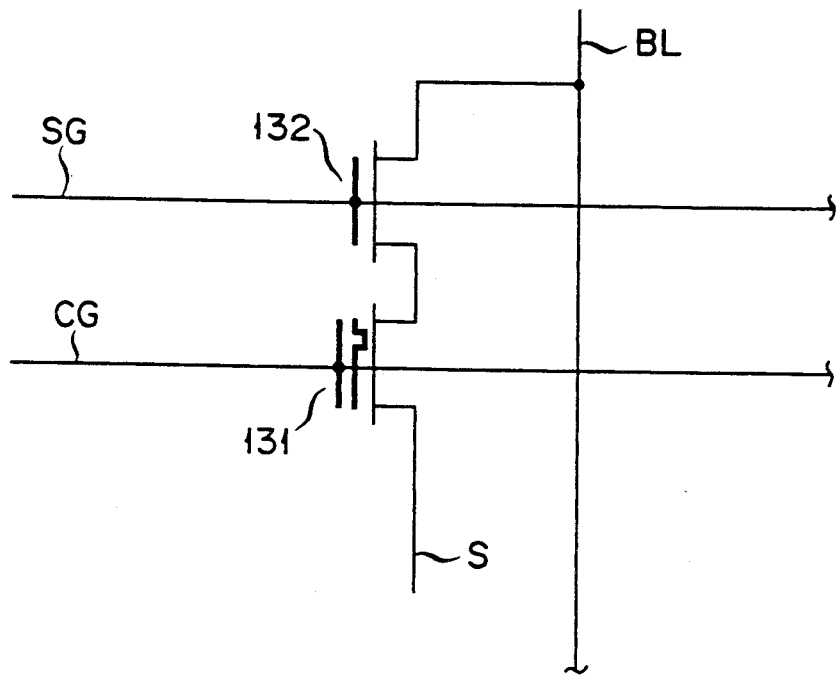
FIG. 2 is an equivalent circuit diagram of the memory cell shown in FIG. 1.

Like the conventional memory cell shown in FIG. 2, the memory cell has three operation modes, i.e., data-erasing mode, data-writing mode, and data-reading mode. FIG. 10 shows the voltages applied to the write line WL, the write-gate line WG, the control-gate line CG, the read-gate line RG, and the read line RL.

To set the memory cell to the data-erasing mode (i.e., the electron injection mode), 0 V, 20 V, 20 V, and 0 V are applied to the lines WL, WG, CG, and RG, respectively. Any voltage can be applied to the read line RL. When 20 V is applied to the write-gate line WG, the second selecting transistor 53 is turned on, and the N-type diffusion layer 33 is set at 0 V, i.e., the voltage applied to the write line WL. At this time, a high voltage applied to the control-gate line CG is applied to the floating-gate electrode 40, too. Since the voltage applied to the read-gate line RG is 0 V, the first selecting transistor 51 is turned off, and the N-type diffusion layer 32 is set in a floating condition. As a result, an intense electric field is applied to the thin insulating film 41 interposed between the floating-gate electrode 40 and the N-type diffusion layer 33. Electrons move from the N-type diffusion layer 33 to the floating-gate electrode 40 and are injected into the electrode 40. The threshold voltage of the data-storage transistor 52 therefore increases to, for example, +8 V.

To set the memory cell to the data-writing mode also known as "electron emission mode", 20 V, 20 V, 0 V, and 0 V are applied to the lines WL, WG, CG, and RG, respectively. In this case, too, any voltage can be applied to the read line RL. When 20 V is applied to the write-gate line WG, the second selecting transistor 53 is turned on, and the N-type diffusion layer 33 is set at 20 V (i.e., the voltage applied to the write line WL). An intense electric field is thereby applied to the thin insulating film 41 in the direction opposite to that direction in which the electric field is applied when the memory cell is set in the data-erasing mode. A tunnel current flows from the floating-gate electrode 40 to the N-type diffusion layer 33, and electrons are emitted from the floating-gate electrode 40. As a result of the threshold voltage of the data-storage transistor 52 decreases to, for example, about −5 V.

Figures 3, 4:
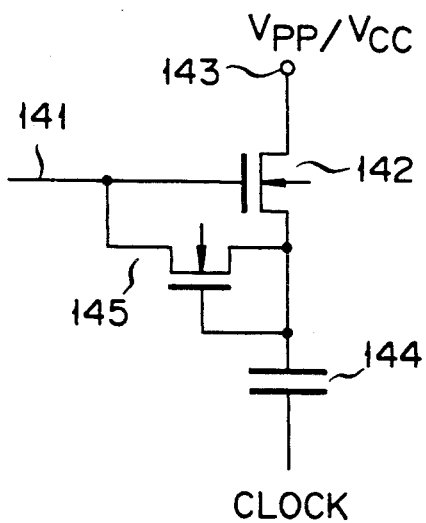
FIG. 3 is a table showing the voltages applied to each component of the memory cell when the conventional E$^2$PROM is set in various operating modes.
FIG. 4 is a circuit diagram representing the level shifter used in the conventional E$^2$PROM.

As can be understood from the above, the memory cell shown in FIG. 7 operates when set in either the data-erasing mode or the data-writing move, in the same way as the conventional memory cell illustrated in FIG. 4.

To set the memory cell to the data-reading mode, 0 V, 5 V, 0 V, 5 V, and 5 V are applied to the lines WL, WG, CG, RG, and RL, respectively. When 5 V is applied to the read-gate line RG and the write-gate line WG, both selecting transistors 51 and 53 are turned on. The N-type diffusion layer 32 is set at 5 V, i.e., the voltage applied to the read line RL, whereas the N-type diffusion layer 33 is set at 0 V (i.e., the voltage applied to the write line WL). If electrons have been injected into the floating-gate electrode 40 of the data-storage transistor 52, and the threshold voltage of this transistor has increased, the transistor 52 remains off, and no currents flow between the read line RL and the write line WL, whereby the read line RL remains at 5 V. In contrast, if electrons have been emitted from the floating-gate electrode 40 of the transistor 52, and the threshold voltage of this transistor has decreased, the transistor 52 is turned on. In this case, a current flows between the read line RL and the write line WL, whereby the read line RL is set at 0 V, i.e., the voltage applied to the write line WL. The sense amplifier 19 (FIG. 5) connected to the read line RL amplifies the decrease in the potential of the read line RL, i.e., 5 V, thus reading logic "1" or logic "0" which is the data stored in the memory cell.

It is essential than 5 V, which is the power-supply voltage applied to the memory cell to read data therefrom, can be applied to the read line RL. Even though the voltage of 5 V is applied to the read line RL, it is possible to prevent soft writing from taking place in the memory cell, and to greatly improve the read-retention characteristic of the memory cell. This is because the voltage on the N-type layer 33 is 0 V since 5 V and 0 V are applied to the write-gate line WG and the write line WL, respectively, when the memory cell is set to the data-reading mode. In other words, no electric field is applied to the thin insulating film 41 isolating the N-type diffusion layer 33 and the floating-gate electrode 40 since the voltages on the line CG and the electrode 40 are almost 0 V, and the voltage on the layer 33 is also 0 V. Hence, electrons are neither injected into, nor emitted from, the floating-gate electrode 40, despite of the tunnel effect.

The voltage on the read line RL changes between 5 V and 0 V as electrons are injected into and emitted from the data-storage transistor 52. Even if the powersupply voltage $V_{CC}$ is comparatively low, the voltage on the read line RL varies between $V_{CC}$ and 0 V, whereby the memory cell has an adequate operation margin. In other words, the E²PROM chip 11 (FIG. 5), which has memory cells of the structure illustrated in FIG. 6, can operate at low voltage, and can therefore be driven by the battery 12 which applies as low as 1.5 V.

As is shown in FIG. 5, the E²PROM chip 11 includes three level shifters 17, 18, and 20. Each of the level shifters comprises a required number of identical units, one of which is illustrated in FIG. 9. As FIG. 9 shows, the unit comprises an input node 61, a CMOS inverter 62, an output node 63, an N-channel MOS transistor 64, a node 65, an N-channel MOS transistor 66, and P-channel MOS transistor 67. Both N-channel MOS transistors are of depletion type. An input signal is supplied to the input node 61, which is connected to the input terminal of the CMOS inverter 62. The source-drain path of the N-type MOS transistor 64 is connected between the output terminal of the inverter 62 and the output node 63. The gate of this transistor 64 is connected to receive a control signal $\overline{PGM}$. The signal PGM is at the logic "0" level when the E²PROM chip 11 is set to the data-erasing mode or the data-writing mode, and is at the logic "1" level when the E²PROM chip 11 is set to the data-reading mode. The source-drain path of the N-channel MOS transistor 66 and that of the P-channel MOS transistor 67 are connected in series between the output node 63 and the node 65 to which the high voltage $V_{PP}$ or the powersupply voltage $V_{CC}$ is applied. The gate of the transistor 66 is coupled to the output node 63, and the gate of the transistor 67 is connected to the input node 61. All transistors shown in FIG. 9, except for the transistor 64 and 66, are of enhancement type.

In order to erase data from any memory cell or write data into the memory cell, the control signal $\overline{PGM}$ is set at the logic "0" level. Then, the high voltage $V_{PP}$ is applied to the node 65. If the input signal is at the "0" level, the output of the inverter 62 is at the logic "1" level which corresponds to the power-supply voltage $V_{CC}$. The input signal also turns the transistor 67 on. A voltage equivalent to the threshold voltage of the transistor 66 is applied to the output node 63 since the node of the transistors 66 and 67 has already been charged to the threshold voltage of the transistor 66. As a result of this, the transistor 66 is turned on, whereby the high voltage $V_{PP}$ is applied from the node 65 to the output node 63. Since the signal $\overline{PGM}$ is at the logic "0" level, the depletion-type transistor 64 is turned off.

If the input signal is at the logic "1" level of the voltage $V_{CC}$ when the memory cell is in the data-erasing mode or the data-writing mode, the output of the inverter 62 is at the logic "0" level which is equivalent to the voltage $V_{SS}$, to turn the transistor 66 off. The $V_{CC}$ input voltage is also applied to the gate of the transistor 67 to turn it off. Hence, the threshold voltage of the transistor 66 is applied to the source of the transistor 67.

In order to read data from the memory cell, the control signal PGM is set at the logic "1" level. In this case, the power-supply voltage $V_{CC}$ is applied to the node 65. Since the signal PGM is at the logic "1" level, the transistor 64 is turned on. The input signal inverted by the inverter 62 is supplied to the output node 63 through the transistor 64.

Unlike in the level shifter shown in FIG. 4, it is unnecessary to boost the voltage at a point within the level shifter by means of a capacitor to which a clock signal is input. The level-shifter unit shown in FIG. 9 can operate even if the power-supply voltage $V_{CC}$ decreases. In other words, the unit has a great operation margin at a low power-supply voltage. Due to the use of the level sifters each comprising units of the type shown in FIG. 9, the E²PROM chip 11 (FIG. 5) can operate at a low voltage.

FIG. 10 is a cross-sectional view illustrating a memory cell of a different type which can be used in the memory-cell matrix 13 (FIG. 5). As is illustrated in FIG. 10, the memory cell comprises a P-type semiconductor substrate 70. Three N-type diffusion layers 71, 72, and 73 are formed in the upper surface of the substrate 70. A channel region 74 is located between the diffusion layers 71 and 72, and a channel region 80 is located between the diffusion layers 72 and 73. An insulating film is formed on the upper surface of the substrate 70. The film consists of two thick portions 75 and 81 and one thin portion 77. The thin portion 77 is located on the diffusion layer 77. An electrode 76 made of polycrystalline silicon is formed on the thick portion 75 and thin portion 77 of the insulting film 75 and located above the diffusion layer 72 and the channel region 74. A relatively thick insulating film 78 is formed on the electrode 76, and an electrode 79 made of polycrystalline silicon is formed on the insulating film 78. An electrode 82 made of polycrystalline silicon is formed on the tick portion 81 of the insulating film and located above the channel region 80.

A read line RL and a write line WL are connected to the diffusion layers 71 and 73, respectively. The electrodes 76, 79, and 82 are used as floating-gate electrode, control-gate electrode, and gate electrode, respectively. The electrodes 79 and 82 are connected to a control-gate line CG and a selection-gate line SG, respectively.

FIG. 11 is an equivalent circuit diagram showing the memory cell illustrated in FIG. 10. As FIG. 11 shows, the memory cell comprises a floating-gate MOS transistor 91 and a MOS transistor 92 of the ordinary type. The MOS transistor 91 is a data-storage transistor; its source and drain are the diffusion layers 71 and 72. The MOS transistor 92 is a selecting transistor for selecting the MOS transistor 91; its source and drain are the diffusion layers 72 and 73.

Like the conventional memory cell (FIG. 2), the memory cell has three operation modes, i.e., data-erasing mode, data-writing mode, and data-reading mode.

FIG. 12 shows the voltages applied to the write line WL, the selection-gate line SG, the control-gate line CG, and the read line RL, in the three operation modes.

To set the memory cell to the data-erasing mode (i.e., the electron injection mode), 0 V, 20 V, 20 V and 0 V are applied to the lines WL, SG, CG, and RL, respectively. When the selection-gate line SG is set at 20 V, the selecting transistor 92 is turned on, whereby the N-type diffusion layer 72 is set at 0 V, i.e., the voltage applied to the write line WL. The high voltage of 20 V applied to the control-gate line CG is applied to the floating-gate electrode 76. An intense electric field is therefore applied to the thin insulating film 77 interposed between the floating-gate electrode 76 and the N-type diffusion layer 72. Hence, a tunnel current flows from the diffusion layer 72 to the electrode 76. In other words, electrons are injected into the floating-gate electrode 76. As a result, the threshold voltage of the data-storage transistor 91 to, for example, about +8 V.

To set the memory cell to the data-writing mode (i.e., the electron emission mode), 20 V, 20 V, 0 V, and 5 V are applied to the lines WL, SG, CG, and RL, respectively. When the selection-gate line SG is set at 20 V, the selecting transistor 92 is turned on, whereby the N-type diffusion layer 72 is set at 20 V, i.e., the voltage applied to the write line WL. An intense electric field is applied to the thin insulating film 77 in the direction opposite to that in which the field is applied when the memory cell is set in the data-erasing mode. Hence, a tunnel current flows from the floating-gate electrode 76 to the N-type diffusion layer 72. In other words, electrons are emitted from the floating-gate electrode 76. As a result of this, the threshold voltage of the data-storage transistor 91 decreases to, for example, about −5 V.

As can be understood from the above, the memory cell shown in FIG. 11 operates in the same way as the conventional cell (FIG. 4), when it is set in either the data-erasing mode or the data-writing mode.

To set the memory cell to the data-reading mode, 0 V, 5 V, 0 V, and 5 V are applied to the lines WL, SG, CG, and RL, respectively. When the selection-gate line SG is set at 5 V, the selecting transistor 92 is turned on, whereby the N-type diffusion layer 72 is set at 0 V, i.e., the voltage applied to the write line WL. If electrons have been injected into the floating-gate electrode 76, and the threshold voltage of the data-storage transistor 91 has increased, the transistor 91 remains off. Therefore, no currents flow between the read line RL and the write line WL, and the read line RL remains at 5 V. In contrast, if electrons have been emitted from the floating-gate electrode 76, and the threshold voltage of the transistor 91 has decreased, the transistor 91 is turned on. In this case, a current flows between the read line RL and the write line WL, and the read line RL is set at a voltage as low as 0 V, i.e., the voltage applied to the write line WL. The sense amplifier 19 (FIG. 5) connected to the read line RL amplifies the decrease in the potential of the read line RL, i.e., a decrease of 5 V, thus reading logic "1" or logic "0" stored in the memory cell.

Also in the memory cell shown in FIG. 11, the voltage on the read line RL changes between 5 V and 0 V as electrons are injected into, and emitted from, the data-storage transistor 91. Even if the power-supply voltage $V_{CC}$ is relatively low, the voltage on the read line RL much varies between $V_{CC}$ and 0 V, whereby the memory cell has an adequate operation margin. In other words, the E²PROM chip 11 (FIG. 5), which has memory cells of the structure shown in FIG. 10, can operate at low voltage, and can therefore be driven by the battery 12 which applies so low a voltage as about 1.5 V.

The E²PROM chip 11, which comprises memory cells of the type illustrated in FIG. 10, can be combined with the level shifters 17, 18, and 20, each having the structure shown in FIG. 9, thereby to constitute an E²PROM. Such an E²PROM can operate at low voltage.

FIG. 13 is a block diagram illustrating an E²PROM which is the second embodiment of the nonvolatile semiconductor memory system according to the invention. This E²PROM is different from the E²PROM shown in FIG. 5, in that two oscillators are used, not only one. The first oscillator 24 is so designed as to output a clock signal of a predetermined frequency when it is driven by a relatively low $V_{CC}$ of, for example, about 1.5 V applied from a battery 12. The second oscillator 25 is so designed as to generate a clock signal of the same frequency when it is driven by a comparatively high $V_{CC}$ of, for example, about 5.5 V applied from the battery 12. A selection circuit 26, which is connected to both oscillators, selects the clock signal output from the first oscillator 24 or the second oscillator 25, and supplies the clock signal to a timer 22 and a voltage booster 23.

The circuit constant of this E²PROM can be changed such that the oscillation frequencies of both oscillators 24 and 25 can be set at values optimum for the low-voltage operation and the high-voltage operation. Hence, the E²PROM can reliably operate at low voltage and also at high voltage. In other words, it can operate over a broad range of operation voltages. The memory-cell matrix 13 of this E²PROM comprises memory cells of the structure illustrated in FIG. 10. This is because the E²PROM needs to operate at low voltage in some cases. Further, the level shifters 17, 18, and 20 incorporated in the E²PROM are, if necessary, of the specific type which is illustrated in FIG. 9.

FIG. 14 is a block diagram showing an E²PROM which is the third embodiment of the nonvolatile semiconductor memory system according to the invention. This E²PROM is different from the E²PROM shown in FIG. 13, in that an input circuit 27 is used in place of the second oscillator 25 (FIG. 13). The input circuit 27 supplies a selector circuit 26 with a clock signal CLK externally generated and having the same frequency as that of the clock signal generated by an oscillator 24, when use is made of a battery 12 which applies a relatively high voltage, for example about 5.5 V.

The circuit constant of the E²PROM shown in FIG. 14 can be determined such that the oscillator 24 has oscillation frequency which is optimal to the low-voltage operation. Hence, the E²PROM can operate with high reliability at low voltage. Since a clock signal required for high-voltage operation is input to the E²PROM, whenever necessary, the E²PROM can also operate stably at high voltage. The memory-cell matrix 13 of this E²PROM comprises memory cells of the structure illustrated in FIG. 6 or FIG. 10. This is because the E²PROM needs to operate at low voltage in some cases. Further, the level shifters 17, 18, and 20 incorporated in the E²PROM are, if necessary, of the specific type which is illustrated in FIG. 9.

FIG. 15 is a block diagram showing an E²PROM which is the fourth embodiment of the nonvolatile semiconductor memory system according to the invention.

This E²PROM is different from the E²PROM shown in FIG. 5, in that an input circuit 28 is used in place of the oscillator 21 (FIG. 5). The input circuit 28 receivers an externally input clock signal of a predetermined frequency, and supplies this signal to the timer 22 and the voltage booster 23.

Since the frequency of the clock signal remains unchanged, regardless of the power-supply voltage applied from the battery 12, the E²PROM can operate with high reliability at both low voltage and high voltage. The memory-cell matrix 13 of this E²PROM comprises memory cells of the structure illustrated in FIG. 6 or FIG. 10. This is because the E²PROM needs to operate at low voltage in some cases. Further, the level shifters 17, 18, and 20 incorporated in the E²PROM are, if necessary, of the specific type which is illustrated in FIG. 9.

As has been described, the present invention can provide a nonvolatile semiconductor memory system which can operate with reliability over a broad range of operation voltages.

What is claimed is:

1. A nonvolatile semiconductor memory system comprising a memory chip and a battery for driving said memory chip, said memory chip comprising:
   a memory-cell matrix comprising a plurality of memory cells arranged in rows and columns;
   a row decoder for selecting one of a plurality of rows of said memory cells;
   a first level-shifting circuit provided between said row decoder and said memory-cell matrix, for level-shifting an amplitude of an output voltage of said row decoder and applying the voltage to said memory-cell matrix;
   a column-selecting circuit for selecting one of a plurality of columns of said memory cells;
   a column decoder for controlling said column-selecting circuit;
   a second level-shifting circuit provided between said column decoder and said column-selecting circuit, for level-shifting an amplitude of an output voltage of said column decoder and applying the voltage to said column-selecting circuit;
   a sense amplifier for detecting data stored in the memory cell selected by said row decoder and said column-selecting circuit;
   a third level-shifting circuit provided between an input data receiving means and said column-selecting circuit, for level-shifting an amplitude of the voltage of an input data in order to write the input data into the memory cell selected by said column decoder and said column-selecting circuit, and applying the voltage to said column-selecting circuit;
   a voltage booster circuit for generating a high voltage required for writing the input data into the memory cell, and applying the high voltage to said first, second and third level-shifting circuits;
   a timer circuit for setting data-writing time for writing data into the memory cells incorporated in said memory-cell matrix, and generating various control signals in accordance with the data-writing time thus set;
   an oscillator circuit for generating a clock signal for driving said voltage booster circuit and said timer circuit; and
   wherein each of said first, second and third level-shifting circuits comprises:
      a CMOS inverter circuit for inverting a signal supplied to a first input node:
      a first MOS transistor of depletion type having a source, gate and drain, one of said source and drain thereof being connected to an output terminal of said CMOS inverter circuit and the other of said source and drain being connected to an output node for supplying a level-shifting signal, and said gate to receive a control signal;
      a second MOS transistor and a third MOS transistor of depletion type each having a source, gate and drain, one of said source and drain of said second MOS transistors being connected to said output node for supplying a level-shifting signal, the other of said source and drain of said second MOS transistor being connected to one of a source and drain of said third depletion MOS transistor, the other of said source and drain of said third depletion MOS transistor being connected to a second input node, the gate of said second MOS transistor being connected to said first input node, and the gate of said third depletion MOS transistor being connected to said output node for supplying a level-shifted signal.

2. The memory system according to claim 1, wherein each of said memory cells comprises:
   a semiconductor substrate of a first conductivity type;
   first, second, third and fourth diffusion layers of a second conductivity type, formed in said substrate;
   a first channel region located between said first and second diffusion layers;
   a second channel region located between said second and third diffusion layers;
   a third channel region located between said third and fourth diffusion layers;
   a first gate electrode formed above said first channel region;
   a floating gate electrode formed above said second channel region, a part of said floating gate electrode formed on a thin insulating film formed on said third diffusion layer and, thus, overlapping said third diffusion layer;
   a control gate electrode formed above said floating gate electrode;
   a second gate electrode formed above said third channel region;
   a write line for applying predetermined voltages to said fourth diffusion layer to erase data from, write data into, and read data from, the memory cell;
   a write-gate line for applying predetermined voltages to said second gate electrode to erase data from, write data into, and read data from, the memory cell;
   a control-gate line for applying predetermined voltages to said control gate electrode to erase data from, write data into, and read data from, the memory cell;
   a read-gate line for applying predetermined voltages to said first gate electrode to erase data from, write data into, and read data from, the memory cell; and
   a read line for applying predetermined voltages to said first diffusion layer to erase data from, write data into, and read data from, the memory cell.

3. The memory system according to claim 1, wherein each of said memory cells comprises:
   a semiconductor substrate of a first conductivity type;
   first, second, third and fourth diffusion layers of a second conductivity type, formed in said substrate;

a first channel region located between said first and second diffusion layers;

a second channel region located between said second and third diffusion layers;

a third channel region located between said third and fourth diffusion layers;

a first gate electrode formed above said first channel region;

a floating gate electrode formed above said second channel region, a part of said floating gate electrode formed on a thin insulating film formed on said third diffusion layer and, thus, overlapping said third diffusion layer;

a control gate electrode formed above said floating gate electrode;

a second gate electrode formed above said third channel region;

a write line for applying predetermined voltages to said fourth diffusion layer to erase data from, write data into, and read data from, the memory cell;

a write-gate line for applying predetermined voltages to said second gate electrode to erase data from, write data into, and read data from, the memory cell;

a control-gate line for applying predetermined voltages to said control gate electrode to erase data from, write data into, and read data from, the memory cell;

a read-gate line for applying predetermined voltages to said first gate electrode to erase data from, write data into, and read data from, the memory cell; and a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source and drain thereof being connected to an output terminal of said CMOS inverter circuit and the other of said source or drain being connected to an output node for supplying a level-shifted signal, and said gate to receive a control signal; and second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said input node, and the gate of said third MOS transistor being connected to said output node for supplying a level-shifted signal.

4. The memory system according to claim 1, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell; and a read line for applying predetermined voltages to said first diffusion layer to erase data from, write data into, and read data from, the memory cell.

5. The memory system according to claim 1, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell;

a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source or drain thereof being connected to an output terminal of said CMOS inverter circuit and the other of said source or drain being connected to an output node for supplying a level-shifted signal, and said gate to receive a control signal; and second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said first input node, and the gate of said third MOS transistor being connected to said output node for supplying a level-shifted signal.

6. A nonvolatile semiconductor memory system comprising a memory chip and a battery for driving said memory chip, said memory chip comprising:
   a memory-cell matrix comprising a plurality of memory cells arranged in rows and columns, each including a nonvolatile transistor;
   a row decoder for selecting one of a plurality of rows of said memory cells;
   a first level-shifting circuit provided between said row decoder and said memory-cell array, for level-shifting an amplitude of an output voltage of said row decoder and applying the voltage to said memory-cell matrix;
   a column-selecting circuit for selecting one of a plurality of columns of said memory cells;
   a column decoder for controlling said column-selecting circuit;
   a second level-shifting circuit provided between column decoder and said column-selecting circuit, for level-shifting an amplitude of an output voltage of said column decoder and applying the voltage to said column-selecting circuit;
   a sense amplifier for detecting data stored in the memory cell selected by said row decoder and said column-selecting circuit;
   a third level-shifting circuit provided between an input data receiving means and said column-selecting circuit, for level-shifting an amplitude of the voltage of an input data in order to write the input data into the memory cell selected by said column decoder and said column-selecting circuit, and applying the voltage to said column-selecting circuit;
   a voltage booster circuit for generating a high voltage required for writing the input data into the memory cell, and applying the high voltage to said first, second and third level-shifting circuits;
   a timer circuit for setting data-writing time for writing data into the memory cells incorporated in said memory-cell matrix, and generating various control signals in accordance with the data-writing time thus set;
   a first oscillator circuit for generating a first clock signal of a predetermined frequency when a power-supply voltage is relatively low;
   a second oscillator circuit for generating a second clock signal of a frequency similar to that of the first clock signal when the power-supply voltage is relatively high;
   a selector circuit for selecting said first or second clock signal, and supplying the selected clock signal as a drive signal to said voltage booster circuit and said timer circuit; and
wherein each of said first, second and third level-shifting circuits comprises:
   a CMOS inverter circuit for inverting a signal supplied to a first input node;
   a first MOS transistor of depletion type having a source, gate and drain, one of said source and drain thereof being connected to an output terminal of said CMOS inverter circuit and the other of said source and drain being connected to an output node for supplying a level-shifting signal, and said gate to receive a control signal;
   a second MOS transistor and a third MOS transistor of depletion type each having a source, gate and drain, one of said source and drain of said second MOS transistors being connected to said output node for supplying a level-shifting signal, the other of said source and drain of said second MOS transistor being connected to one of a source and drain of said third depletion MOS transistor, the other of said source and drain of said third depletion MOS transistor being connected to a second input node, the gate of said second MOS transistor being connected to said first input node, and the gate of said third depletion MOS transistor being connected to said output node for supplying a level-shifted signal.

7. The memory system according to claim 6, wherein each of said memory cells comprises:
   a semiconductor substrate of a first conductivity type;
   first, second, third and fourth diffusion layers of a second conductivity type, formed in said substrate;
   a first channel region located between said first and second diffusion layers;
   a second channel region located between said second and third diffusion layers;
   a third channel region located between said third and fourth diffusion layers;
   a first gate electrode formed above said first channel region;
   a floating gate electrode formed above said second channel region, a part of said floating gate electrode formed on a thin insulating film formed on said third diffusion layer and, thus, overlapping said third diffusion layer;
   a control gate electrode formed above said floating gate electrode;
   a second gate electrode formed above said third channel region;
   a write line for applying predetermined voltages to said fourth diffusion layer to erase data from, write data into, and read data from, the memory cell;
   a write-gate line for applying predetermined voltages to said second gate electrode to erase data from, write data into, and read data from, the memory cell;
   a control-gate line for applying predetermined voltages to said control gate electrode to erase data from, write data into, and read data from, the memory cell;
   a read-gate line for applying predetermined voltages to said first gate electrode to erase data from, write data into, and read data from, the memory cell; and
   a read line for applying predetermined voltages to said first diffusion layer to erase data from, write data into, and read data from, the memory cell.

8. The memory system according to claim 6, wherein each of said memory cells comprises:
   a semiconductor substrate of a first conductivity type;
   first, second, third and fourth diffusion layers of a second conductivity type, formed in said substrate;
   a first channel region located between said first and second diffusion layers;
   a second channel region located between said second and third diffusion layers;

a third channel region located between said third and fourth diffusion layers;

a first gate electrode formed above said first channel region;

a floating gate electrode formed above said second channel region, a part of said floating gate electrode formed on a thin insulating film formed on said third diffusion layer and, thus, overlapping said third diffusion layer;

a control gate electrode formed above said floating gate electrode;

a second gate electrode formed above said third channel region;

a write line for applying predetermined voltages to said fourth diffusion layer to erase data from, write data into, and read data from, the memory cell;

a write-gate line for applying predetermined voltages to said second gate electrode to erase data from, write data into, and read data from, the memory cell;

a control-gate line for applying predetermined voltages to said control gate electrode to erase data from, write data into, and read data from, the memory cell;

a read-gate line for applying predetermined voltages to said first gate electrode to erase data from, write data into, and read data from, the memory cell; and a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source or drain thereof being connected to an output terminal of said CMOS inverter circuit and the other of said source or drain being connected to an output node for supplying a level-shifted signal, and said gate to receive a control signal;

second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said first input node, and the gate of said third MOS transistor being connected to said output node for supplying a level-shifted signal.

9. The memory system according to claim 6, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell; and a read line for applying predetermined voltages to said first diffusion layer to erase data from, write data into, and read data from, the memory cell.

10. The memory system according to claim 6, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell;

a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source or drain thereof being connected to an output terminal of said CMOS inverter circuit and the other of said source or drain being connected to an output node for supplying a level-shifted signal, and said gate to receive a control signal; and second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said first input node, and the gate of said third MOS transistor being connected to said output node for supplying a level-shifted signal.

11. A nonvolatile semiconductor memory system comprising a memory chip and a battery for driving said memory chip, said memory chip comprising:
- a memory-cell matrix comprising a plurality of memory cells arranged in rows and columns, each including a nonvolatile transistor;
- a row decoder for selecting one of a plurality of rows of said memory cells;
- a first level-shifting circuit provided between said row decoder and said memory-cell matrix, for level-shifting an amplitude of an output voltage of said row decoder and applying the voltage to said memory-cell matrix;
- a column-selecting circuit for selecting one of a plurality of columns of said memory cells;
- a column decoder for controlling said column-selecting circuit;
- a second level-shifting circuit provided between said column decoder and said column selecting circuit for level-shifting an amplitude of an output voltage of said column decoder and applying the voltage to said column-selecting circuit;
- a sense amplifier for detecting data stored in the memory cell selected by said row decoder and said column-selecting circuit;
- a third level-shifting circuit provided between an input data receiving means and said column-selecting circuit, for level-shifting an amplitude of the voltage of an input data in order to write the input data into the memory cell selected by said column decoder and said column-selecting circuit, and applying the voltage to said column-selecting circuit;
- a voltage booster circuit for generating a high voltage required for writing the input data into the memory cell, and applying the high voltage to said first, second and third level-shifting circuits;
- a timer circuit for setting data-writing time for writing data into the memory cells incorporated in said memory-cell matrix, and generating various control signals in accordance with the data-writing time thus set;
- an oscillator circuit for generating a first clock signal of a predetermined frequency when a power-supply voltage is relatively low or relatively high;
- a clock-signal input circuit for inputting a second, externally supplied clock signal of a predetermined frequency when the power-supply voltage is relatively high or relatively low;
- a selector circuit for selecting said first or second clock signal, and supplying the selected clock signal as a drive signal to said voltage booster circuit and said timer circuit; and wherein each of said first, second and third level-shifting circuits comprises:
- a CMOS inverter circuit for inverting a signal supplied to a first input node:
- a first MOS transistor of depletion type having a source, gate and drain, one of said source and drain thereof being connected to an output terminal of said CMOS inverter circuit and the other of said source and drain being connected to an output node for supplying a level-shifting signal, and said gate to receive a control signal;
- second MOS transistor and a third MOS transistor of depletion type each having a source, gate and drain, one of said source and drain of said second MOS transistor being connected to said output node for supplying a level-shifting signal, the other of said source and drain of said second MOS transistor being connected to one of a source and drain of said third depletion MOS transistor, the other of said source and drain of said third depletion MOS transistor being connected to a second input node, the gate of said second MOS transistor being connected to said first input node, and the gate of said third depletion MOS transistor being connected to said output node for supplying a level-shifted signal.

12. The memory system according to claim 11, wherein each of said memory cells comprises:
- a semiconductor substrate of a first conductivity type;
- first, second, third and fourth diffusion layers of a second conductivity type, formed in said substrate;
- a first channel region located between said first and second diffusion layers;
- a second channel region located between said second and third diffusion layers;
- a third channel region located between said third and fourth diffusion layers;
- a first gate electrode formed above said first channel region;
- a floating gate electrode formed above said second channel region, a part of said floating gate electrode formed on a thin insulating film formed on said third diffusion layer and, thus, overlapping said third diffusion layer;
- a control gate electrode formed above said floating gate electrode;
- a second gate electrode formed above said third channel region;
- a write line for applying predetermined voltages to said fourth diffusion layer to erase data from, write data into, and read data from, the memory cell;
- a write-gate line for applying predetermined voltages to said second gate electrode to erase data from, write data into, and read data from, the memory cell;
- a control-gate line for applying predetermined voltages to said control gate electrode to erase data from, write data into, and read data from, the memory cell;
- a read-gate line for applying predetermined voltages to said first gate electrode to erase data from, write data into, and read data from, the memory cell; and
- a read line for applying predetermined voltages to said first diffusion layer to erase data from, write data into, and read data from, the memory cell.

13. The memory system according to claim 11, wherein each of said memory cells comprises:
- a semiconductor substrate of a first conductivity type;
- first, second, third and fourth diffusion layers of a second conductivity type, formed in said substrate;
- a first channel region located between said first and second diffusion layers;
- a second channel region located between said second and third diffusion layers;
- a third channel region located between said third and fourth diffusion layers;
- a first gate electrode formed above said first channel region;

a floating gate electrode formed above said second channel region, a part of said floating gate electrode formed on a thin insulating film formed on said third diffusion layer and, thus, overlapping said third diffusion layer;

a control gate electrode formed above said floating gate electrode;

a second gate electrode formed above said third channel region;

a write line for applying predetermined voltages to said fourth diffusion layer to erase data from, write data into, and read data from, the memory cell;

a write-gate line for applying predetermined voltages to said second gate electrode to erase data from, write data into, and read data from, the memory cell;

a control-gate line for applying predetermined voltages to said control gate electrode to erase data from, write data into, and read data from, the memory cell;

a read-gate line for applying predetermined voltages to said first gate electrode to erase data from, write data into, and read data from, the memory cell; and a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source or drain thereof being connected to an output terminal of said CMOS inverter circuit and the other of said source or drain being connected to an output node for supplying a level-shifted signal, and said gate to receive a control signal; and second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said first input node, and the gate of said third MOS transistor being connected to said output node for supplying a level-shifted signal.

14. The memory system according to claim 11, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell; and a read line for applying predetermined voltages to said first diffusion layer to erase data from, write data into, and read data from, the memory cell.

15. The memory system according to claim 11, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell;

a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source or drain thereof being connected to an output terminal of said CMOS inverter circuit and the other of said source or drain being connected to an output node for supplying a level-shifted signal, and said gate to receive a control signal; and second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said first input node, and the gate of said third MOS transistor being connected to said output node for supplying a level-shifted signal.

16. A nonvolatile semiconductor memory system comprising a memory chip and a battery for driving said memory chip, said memory chip comprising:
- a memory-cell matrix comprising a plurality of memory cells arranged in rows and columns, each including a nonvolatile transistor;
- a row decoder for selecting one of a plurality of rows of said memory cells;
- a first level-shifting circuit provided between said row decoder and said memory-cell matrix, for level-shifting an amplitude of an output voltage of said row decoder and applying the voltage to said memory-cell matrix;
- a column-selecting circuit for selecting one of a plurality of columns of said memory cells;
- a column decoder for controlling said column-selecting circuit;
- a second level-shifting circuit provided between said column decoder and said column-selecting circuit, for level-shifting an amplitude of an output voltage of said column decoder and applying the voltage to said column-selecting circuit;
- a sense amplifier for detecting data stored in the memory cell selected by said row decoder and said column-selecting circuit;
- a third level-shifting circuit provided between an input data receiving means and said column-selecting circuit, for level-shifting an amplitude of the voltage of an input data in order to write the input data into the memory cell selected by said column decoder and said column-selecting circuit, and applying the voltage to said column-selecting circuit;
- a voltage booster circuit for generating a high voltage required for writing the input data into the memory cell, and applying the high voltage to said first, second and third level-shifting circuits;
- a timer circuit for setting data-writing time for writing data into the memory cells incorporated in said memory-cell matrix, and generating various control signals in accordance with the data-writing time thus set;
- a clock-signal input circuit for receiving an externally input clock signal of a predetermined frequency and supplying the clock signal to said voltage booster circuit and said timer circuit; and wherein each of said first, second and third level-shifting circuits comprises:
- a CMOS inverter circuit for inverting a signal supplied to a first input node:
- a first MOS transistor of depletion type having a source, gate and drain, one of said source and drain thereof being connected to an output terminal of said CMOS inverter circuit and the other of said source and drain being connected to an output node for supplying a level-shifting signal, and said gate to receive a control signal;
- second MOS transistor and a third MOS transistor of depletion type each having a source, gate and drain, one of said source and drain of said second MOS transistors being connected to said output node for supplying a level-shifting signal, the other of said source and drain of said second MOS transistor being connected to one of a source and drain of said third depletion MOS transistor, the other of said source and drain of said third depletion MOS transistor being connected to a second input node, the gate of said second MOS transistor being connected to said first input node, and the gate of said third depletion MOS transistor being connected to said output node for supplying a level-shifted signal.

17. The memory system according to claim 16, wherein each of said memory cells comprises:
- a semiconductor substrate of a first conductivity type;
- first, second, third and fourth diffusion layers of a second conductivity type, formed in said substrate;
- a first channel region located between said first and second diffusion layers;
- a second channel region located between said second and third diffusion layers;
- a third channel region located between said third and fourth diffusion layers;
- a first gate electrode formed above said first channel region;
- a floating gate electrode formed above said second channel region, a part of said floating gate electrode formed on a thin insulating film formed on said third diffusion layer and, thus, overlapping said third diffusion layer;
- a control gate electrode formed above said floating gate electrode;
- a second gate electrode formed above said third channel region;
- a write line for applying predetermined voltages to said fourth diffusion layer to erase data from, write data into, and read data from, the memory cell;
- a write-gate line for applying predetermined voltages to said second gate electrode to erase data from, write data into, and read data from, the memory cell;
- a control-gate line for applying predetermined voltages to said control gate electrode to erase data from, write data into, and read data from, the memory cell;
- a read-gate line for applying predetermined voltages to said first gate electrode to erase data from, write data into, and read data from, the memory cell; and
- a read line for applying predetermined voltages to said first diffusion layer to erase data from, write data into, and read data from, the memory cell.

18. The memory system according to claim 16, wherein each of said memory cells comprises:
- a semiconductor substrate of a first conductivity type;
- first, second, third and fourth diffusion layers of a second conductivity type, formed in said substrate;
- a first channel region located between said first and second diffusion layers;
- a second channel region located between said second and third diffusion layers;
- a third channel region located between said third and fourth diffusion layers;
- a first gate electrode formed above said first channel region;
- a floating gate electrode formed above said second channel region, a part of said floating gate electrode formed on a thin insulating film formed on said third diffusion layer and, thus, overlapping said third diffusion layer;
- a control gate electrode formed above said floating gate electrode;
- a second gate electrode formed above said third channel region;
- a write line for applying predetermined voltages to said fourth diffusion layer to erase data from, write data into, and read data from, the memory cell;

a write-gate line for applying predetermined voltages to said second gate electrode to erase data from, write data into, and read data from, the memory cell;

a control-gate line for applying predetermined voltages to said control gate electrode to erase data from, write data into, and read data from, the memory cell;

a read-gate line for applying predetermined voltages to said first gate electrode to erase data from, write data into, and read data from, the memory cell; and a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source or drain thereof being connected to an output terminal of said CMOS inverter circuit and the other of said source or drain being connected to an output node for supplying a level-shifted signal, and said gate to receive a control signal; and second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said first input node, and the gate of said third MOS transistor being connected to said output node for supplying a level-shifted signal.

19. The memory system according to claim 16, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell; and a read line for applying predetermined voltages to said first diffusion layer to erase data from, write data into, and read data from, the memory cell.

20. The memory system according to claim 16, wherein each of said memory cells comprises:

a semiconductor substrate of a first conductivity type;

first, second, and third diffusion layers of a second conductivity type, formed in said substrate;

a first channel region located between said first and second diffusion layers;

a second channel region located between said second and third diffusion layers;

a floating gate electrode formed above said first channel region, a part of said floating gate electrode formed on a thin insulating film formed on said second diffusion layer and, thus, overlapping said second diffusion layer;

a control gate electrode formed above said floating gate electrode;

a gate electrode formed above said second channel region;

a control-gate line for applying predetermined voltages to said control gate electrode to erase data from, write data into, and read data from, the memory cell;

a selection-gate line for applying predetermined voltages to said gate electrode to erase data from, write data into, and read data from, the memory cell;

a write line for applying predetermined voltages to said third diffusion layer to erase data from, write data into, and read data from, the memory cell;

a read line for applying predetermined voltages to said first diffusion layer to erase data from, write data into, and read data from, the memory cell;

each of said first, second, and third level-shifting circuits comprises:

a CMOS inverter circuit for inverting a signal supplied to a first input node;

a first MOS transistor of depletion type having a source, gate and drain, one of said source or drain thereof being connected to an output terminal of said CMOS inverter circuit and the other of said source or drain being connected to an output node for supplying a level-shifted signal, and said gate to receive a control signal; and second and third MOS transistors each having a source, gate and drain, one of said source or drain of said second MOS transistor being connected to said output node for supplying a level-shifted signal, the other of said source or drain of said second MOS transistor being connected to one of a source or drain of said third MOS transistor, the other of said source or drain of said third MOS transistor being connected to a second input node, the gate of said second MOS transistor being connected to said first input node, and the gate of said third MOS transistor being connected to said output node for supplying a level-shifted signal.

* * * * *

UNITED STATES PATENT AND TRADEMARK OFFICE
CERTIFICATE OF CORRECTION

PATENT NO. : 5,058,063

DATED : October 15, 1991

INVENTOR(S) : Yukio Wada et al.

It is certified that error appears in the above-identified patent and that said Letters Patent is hereby corrected as shown below:

Abstract, line 2, change "batttery" to --battery--.

Claim 3, column 17, line 35, after "cell" change ";" to --.--.

Claim 3, column 17, lines 36 thru 59, Delete in their entireties.

Claim 5, column 18, line 53, after "cell" change ";" to --.--.

Claim 5, column 18, lines 54 thru 68, Delete in their entireties.

Claim 5, column 19, lines 1 thru 9, Delete in their entireties.

Claim 8, column 21, line 30, after "cell" change ";" to --.--.

Claim 8, column 21, lines 31, thru 54, Delete in their entireties.

UNITED STATES PATENT AND TRADEMARK OFFICE
CERTIFICATE OF CORRECTION

PATENT NO. : 5,058,063

DATED : October 15, 1991

INVENTOR(S) : Yukio Wada et al.

It is certified that error appears in the above-identified patent and that said Letters Patent is hereby corrected as shown below:

Claim 10, column 22, line 48, after "cell" change ";" to --.--.

Claim 10, column 22, lines 49 thru 68, Delete in their entireties.

Claim 10, column 23, lines 1 thru 4, Delete in their entireties.

Claim 11, column 24, line 1, before "second" insert --a--.

Claim 13, column 25, line 26, after "cell" change ";" to --.--.

Claim 13, column 25, line 27 thru 50, Delete in their entireties.

Claim 15, column 26, line 44, after "cell" change ";" to --.--.

Claim 15, column 26, lines 45 thru 68, Delete in their entireties.

Claim 16, column 27, line 58, before "second" insert --a--.

UNITED STATES PATENT AND TRADEMARK OFFICE
CERTIFICATE OF CORRECTION

PATENT NO. : 5,058,063

DATED : October 15, 1991

INVENTOR(S) : Yukio Wada et al.

It is certified that error appears in the above-identified patent and that said Letters Patent is hereby corrected as shown below:

```
Claim 18, column 29, line 15, after "cell" change ";"
to --.--.
Claim 18, column 29, lines 16 thru 41 Delete in their
entireties.
Claim 20, column 30, line 40, after "cell" change ";"
to --.--.
Claim 20, column 30, lines 41 thru 64 Delete in their
entirety.
```

Signed and Sealed this

Seventh Day of September, 1993

*Attest:*

BRUCE LEHMAN

*Attesting Officer*   Commissioner of Patents and Trademarks